United States Patent
Hofmann et al.

(10) Patent No.: US 10,502,631 B2
(45) Date of Patent: Dec. 10, 2019

(54) THERMOPILE TEST STRUCTURE AND METHODS EMPLOYING SAME

(71) Applicant: X-FAB Semiconductor Foundries AG, Erfurt (DE)

(72) Inventors: Peter Hofmann, Radeberg (DE); Kerst Griesbach, Dresden (DE); Monika Reinhold, Freital (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 28 days.

(21) Appl. No.: 15/625,182

(22) Filed: Jun. 16, 2017

(65) Prior Publication Data

US 2017/0363477 A1 Dec. 21, 2017

(30) Foreign Application Priority Data

Jun. 17, 2016 (GB) .................... 1610660.1

(51) Int. Cl.
| | | |
|---|---|---|
| *G01J 5/00* | (2006.01) | |
| *G01K 7/00* | (2006.01) | |
| *G01J 5/14* | (2006.01) | |
| *G01K 7/02* | (2006.01) | |
| *H01L 35/04* | (2006.01) | |
| *H01L 35/30* | (2006.01) | |
| *H01L 35/34* | (2006.01) | |

(52) U.S. Cl.
CPC ............... *G01J 5/14* (2013.01); *G01K 7/02* (2013.01); *H01L 35/04* (2013.01); *H01L 35/30* (2013.01); *H01L 35/34* (2013.01)

(58) Field of Classification Search
USPC .................. 374/126, 166, 110, 178, 121
See application file for complete search history.

(56) References Cited

U.S. PATENT DOCUMENTS

| | | | | |
|---|---|---|---|---|
| 4,111,717 A | | 9/1978 | Baxter | |
| 5,050,543 A | * | 9/1991 | Kawamura | ............... F01L 9/04 123/90.11 |
| 5,100,479 A | * | 3/1992 | Wise | ......................... G01J 5/12 136/220 |
| 6,348,650 B1 | * | 2/2002 | Endo | ......................... G01J 5/12 136/201 |
| 6,987,223 B2 | * | 1/2006 | Schneider | .............. G01K 7/021 136/224 |
| 9,759,613 B2 | * | 9/2017 | Kimura | ..................... G01J 5/16 |

(Continued)

FOREIGN PATENT DOCUMENTS

| | | |
|---|---|---|
| EP | 1 162 440 | 12/2001 |
| EP | 1 312 903 | 5/2003 |

OTHER PUBLICATIONS

Combined Search and Examination Report for GB1610660.1 dated Dec. 15, 2016, 9 pages.

(Continued)

*Primary Examiner* — Mirellys Jagan
(74) *Attorney, Agent, or Firm* — Nixon & Vanderhye PC

(57) ABSTRACT

A semiconductor product comprising: a semiconductor substrate and a test structure, the test structure comprising: a thermopile and at least one temperature sensitive element, the at least one temperature sensitive element being located in the substrate, or between the substrate and the thermopile.

24 Claims, 11 Drawing Sheets

(56) References Cited

U.S. PATENT DOCUMENTS

| 2002/0037026 | A1* | 3/2002 | Sato | G01J 5/02 |
| --- | --- | --- | --- | --- |
| | | | | 374/132 |
| 2002/0170589 | A1* | 11/2002 | Hamamoto | G01J 5/12 |
| | | | | 136/225 |
| 2007/0034799 | A1 | 2/2007 | Watanabe | |
| 2007/0227575 | A1 | 10/2007 | Kato et al. | |
| 2008/0317087 | A1† | 12/2008 | Kimura | |

OTHER PUBLICATIONS

M. Von Arx, et al., "Test Structures to Measure the Seebeck Coeffiecient of CMOS IC Polysilicon," IEEE Transactions on Semiconductor Manufacturing, vol. 10, No. 2, pp. 201-208 (May 1997), Institute of Electrical and Electronics Engineers.†

Jin Xie, et al., "Microstructures for Characterization of Seebeck Coefficient of Doped Silicon Films," Microsyst. Technol., vol. 17, pp. 77-83, published on-line Dec. 17, 2010, Springer-Verlag.†

\* cited by examiner
† cited by third party

THERMOPILE TEST STRUCTURE AND METHODS EMPLOYING SAME

This application claims priority to GB Patent Application No. 1610660.1 filed Jun. 17, 2016, the entire content of which is hereby incorporated by reference.

TECHNICAL FIELD

The present invention relates to thermopiles and more specifically to thermopiles fabricated in integrated circuits. The present invention provides methods for manufacturing and testing integrated thermopiles, as well as integrated thermopile test structures for use in such methods.

BACKGROUND

Thermocouples are electrical devices consisting of two different conductors forming an electrical junction. A temperature difference between the junction of the two different conductors and a region occupied by the two conductors remote from the junction results in a temperature-dependent voltage being generated as a result of the thermoelectric effect. This voltage can be used to determine temperature, and as such thermocouples are a widely-used type of temperature sensor.

The thermoelectric effect is the direct conversion of temperature gradients to electric voltage and vice versa. As such, a thermoelectric device, such as a thermocouple, generates voltage when there is a different temperature between the junction of the two different conductors and a region occupied by the two conductors away from the junction. The thermoelectric effect can be used to measure temperature (by measuring induced voltage caused by a temperature difference) or to change the temperature of objects (by applying a voltage).

Thermopiles are devices employing multiple thermocouples, usually connected in series, and can be used for measuring the intensity of incident radiation, typically visible or infrared light.

Prior art thermopiles are described in U.S. Pat. No. 4,111,717 and US published patent application no. US 2007/0034799 A1, the entire contents of each of which are incorporated herein by reference.

The basic structure of an infrared sensor 100 employing a thermopile is illustrated in FIG. 1. The sensor comprises: a baseplate 101 (e.g. silicon substrate with an insulator coating); a membrane portion 102 (represented by dashed line), where the base plate has been partially back-etched to leave a much thinner portion in the centre of the sensor; and the thermopile 103 itself comprising a plurality of thermocouple elements, each comprising two different conductors 104 and 105. The thermopile generates an output voltage $V_{out}$ proportional to the temperature difference between the membrane portion (hot side, 'H') and the outer baseplate portion (cold side, 'C'). The individual thermocouples are connected in series in a chain, such that going in a clockwise manner around the perimeter of the thermopile one encounters a conductor of type 104 connected (at the cold side, 'C') to a conductor of type 105 connected (at the hot side, 'H') to a conductor of type 104 and so forth around the thermopile.

In operation, incident radiation raises the temperature of the membrane portion 102 more, or more quickly, than the outer baseplate portion 101, owing to the lower thermal capacity of the membrane portion, which results in the hot side contacts of the thermopile increasing (or increasing more quickly) in temperature relative to the cold side contacts, thereby generating a measurable voltage $V_{out}$ by the thermoelectric effect.

This voltage can be used to determine, or at least to provide a measure/indication of, the intensity of the incident radiation, in particular if certain quantities, such as the wavelength of the radiation, are known. This measure/indication of intensity will be more accurate if the thermopile itself is well-characterized. Prior art methods for thermopile characterization entail the inclusion of additional, permanent temperature sensitive elements and heaters in the infrared sensor. For example, US 2007/0034799 A1 discloses an infrared sensor which permanently includes a heater and thermo-sensitive resistors in an upper conductive layer of the device structure, which is shared with one or more layers of the thermopile itself. The thermo-sensitive resistors are placed in the cold and hot sides of the thermopile. In operation testing, a voltage is applied to the heater to increase the temperature of the membrane portion, and constant currents are applied to the thermo-sensitive resistors. This can be used to independently determine the temperature difference between the hot and cold sides of the thermopile. This can then be linked with a reading taken from the thermopile itself to test the operation of the sensor.

SUMMARY

The present inventors have appreciated a number of draw-backs with prior art thermopile characterization methods. For example, in US 2007/0034799 A1 it is required that the base plate be hollowed out to form a membrane portion prior to performing the independent thermopile characterization using the heater and thermo-sensitive resistors. This is because without the membrane having been formed first, there would be an insufficient temperature difference between the hot and cold sides of the thermopile to enable a sufficiently accurate characterization using thermo-sensitive resistors, which have relatively ill-controlled properties and are generally less temperature sensitive than e.g. diodes which are used in certain embodiments of the present invention. This requirement in the prior art, namely that the membrane portion necessarily be formed to enable characterization, makes it difficult to perform the thermopile characterization at the wafer testing stage of the fabrication process. This is because removing the central part of the substrate to form the membrane portion makes handling the wafer very difficult and time consuming, with a heightened risk of damaging the wafer during handling, for example.

Furthermore, in US 2007/0034799 A1, since the thermo-sensitive resistors are provided in an upper conductive layer of the device, they cannot be removed at a later stage without damaging or destroying the thermopile. Also, since the thermo-sensitive resistors share one or more of the same layers as the thermopile itself, the possible thermopile geometries are restricted. For example, a desired thermopile geometry may be difficult if not impossible to achieve as the additional thermo-sensitive elements and heaters must to be allowed for in co-occupied layers.

To summarize the state of the art, the arrangement described in US 2007/0034799 A1 does not allow the thermopile-based sensor to be characterized accurately and at an early stage during fabrication. This is a considerable disadvantage for a semiconductor foundry as, according to the prior art approach, sub-optimal thermopiles may only be identified after additional processing steps have been performed, e.g. back etching to form the membrane. This may result in increased waste and cost. Furthermore, prior art thermopile-based sensors sacrifice real-world performance by including the additional temperature sensitive elements in upper layers which are shared by the thermopile, thereby restricting the possible thermopile geometries and surface area.

Aspects of the invention are set out in the independent claims.

The present inventors have appreciated that it is desirable to be able to test the integrated thermopile elements during electrical production testing, e.g. at the wafer testing stage. Wafer testing is a step performed during semiconductor device fabrication during which some or all of the individual integrated circuits (e.g. individual thermopile elements) that are present on the wafer are tested for production defects. The present inventors have further appreciated that it may not be necessary to test each individual integrated circuit (i.e. each thermopile element) on the wafer. Instead, one or more thermopile test structures may be distributed around the wafer, in addition to the production thermopile structures which will be used in finalised devices.

Certain embodiments of the present invention enable more-robust monitoring of the intrinsic sensitivity and operation of the thermopile. Certain embodiments of the present invention enable this to be performed efficiently at the wafer testing stage without the need to back-etch the substrate to form a membrane portion, a significant advantage for a semiconductor device foundry. Furthermore, embodiments of the present invention may be non-perturbative to the customer's desired thermopile layout. Thermopile test structures according to certain embodiments of the present invention do not impact on the customer's desired design. Certain embodiments of the present invention enable day-to-day production monitoring and advantageously enable defective thermopile fabrication to be identified at an earlier stage in the production process, e.g. at the wafer testing stage prior to back etching. This provides many advantages for a semiconductor foundry including reduced time wastage and cost.

BRIEF DESCRIPTION OF THE DRAWINGS

Some embodiments of the invention will now be described by way of example only and with reference to the accompanying drawings, in which.

DETAILED DESCRIPTION

Thermopile structures can be employed in discrete devices or integrated circuits. Integrated thermopile devices may be manufactured using CMOS technology, for example, and many separate devices may be fabricated on a single semiconductor wafer.

The process steps for manufacturing an integrated thermopile test structure 200 according to an embodiment of the present invention are now described with reference to FIGS. 2-7b. One skilled in the art would have the necessary knowledge as to how to fabricate the structures illustrated in FIGS. 2-7b once presented with the present disclosure, and as such certain routine details are not provided here.

Figure 1:
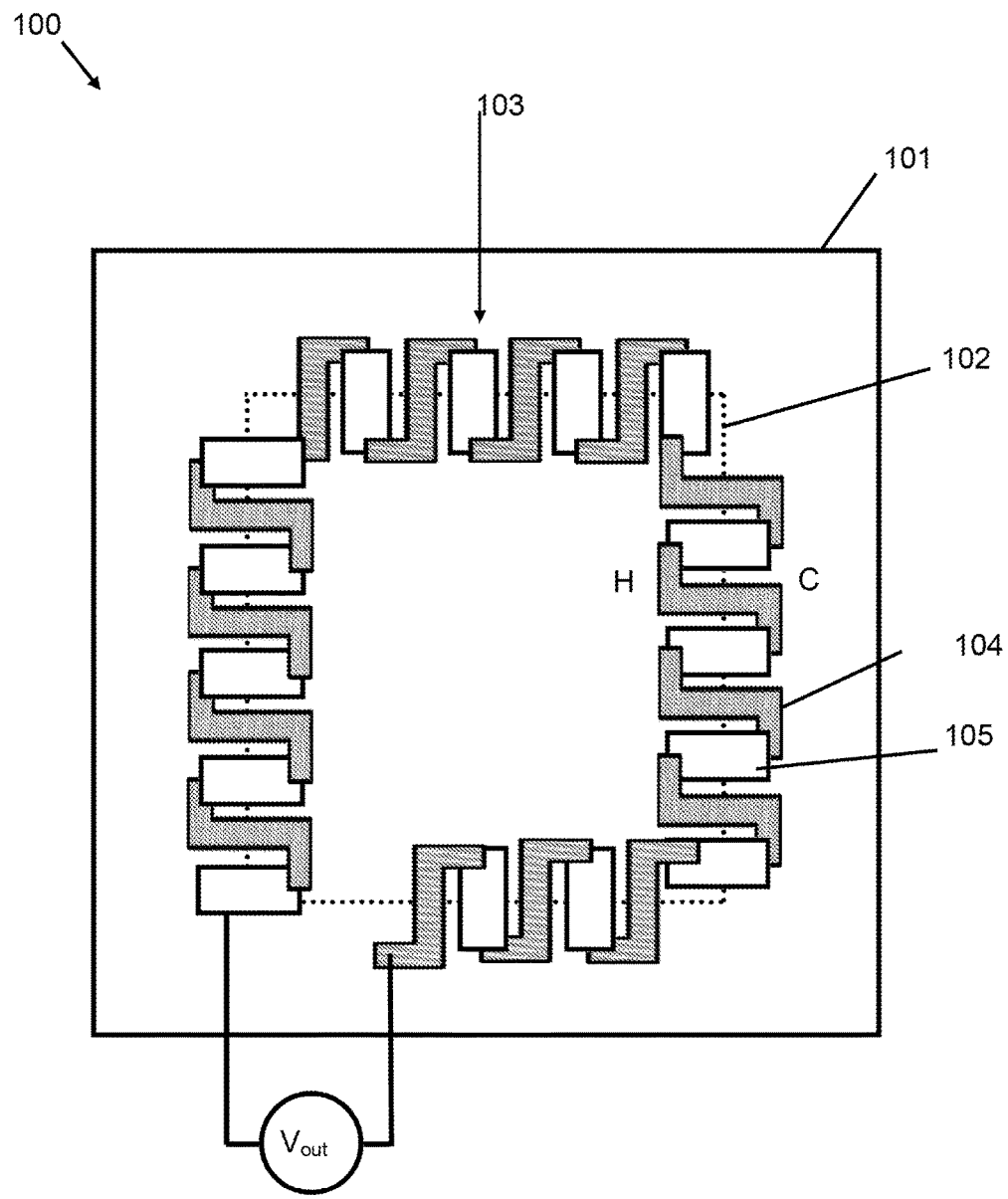
FIG. 1 shows a prior art infrared sensor employing a thermopile.
Figure 2:
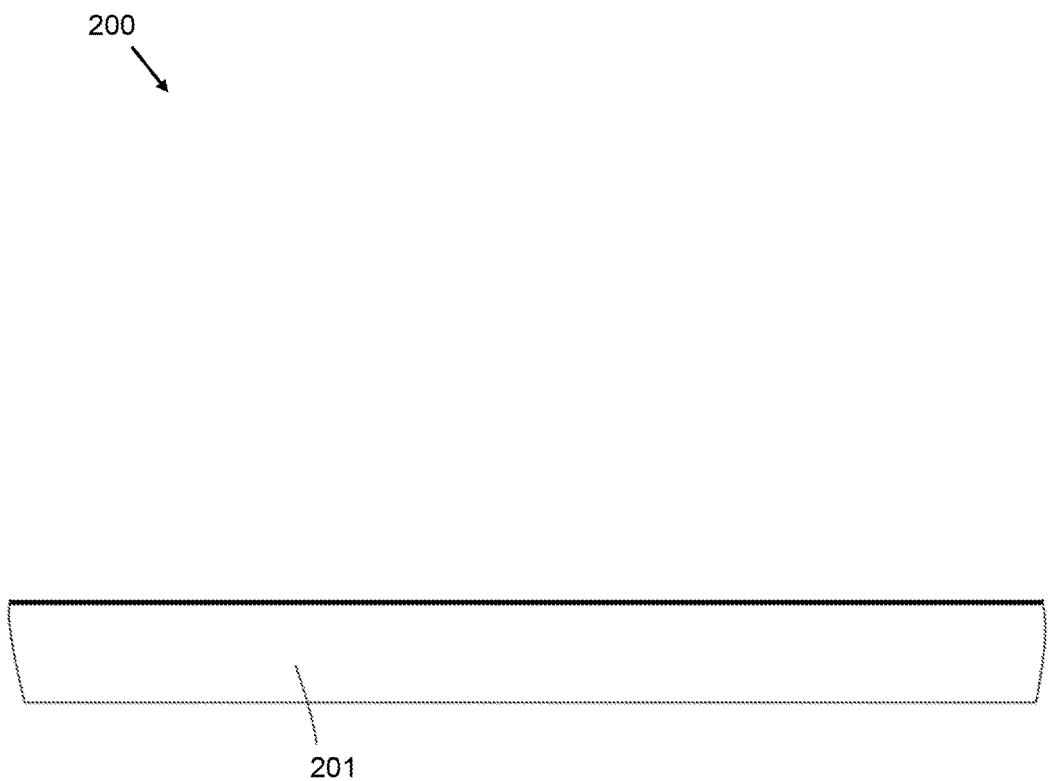
FIG. 2 shows the first stage in manufacturing a thermopile test structure according to an embodiment of the present invention.

FIG. 2 illustrates, in cross-section, a semiconductor substrate 201, such as silicon, for example, on and in which the thermopile test structure 200 will be fabricated. The thickness of the substrate is typically 500 µm to 1000 µm, and may be further reduced by approximately a factor of 10 later in the manufacturing process (e.g. prior to back etching). The substrate may form a wafer, which will usually contain a number of thermopile test structures in addition to a number of production thermopile structures, the latter being destined for final, 'customer' devices whereas the former may be used only for electrical production testing and not form part of a 'customer' device (although it is contemplated that the former could also be used in final devices, and need not necessarily be disposed of after testing).

Figure 3:
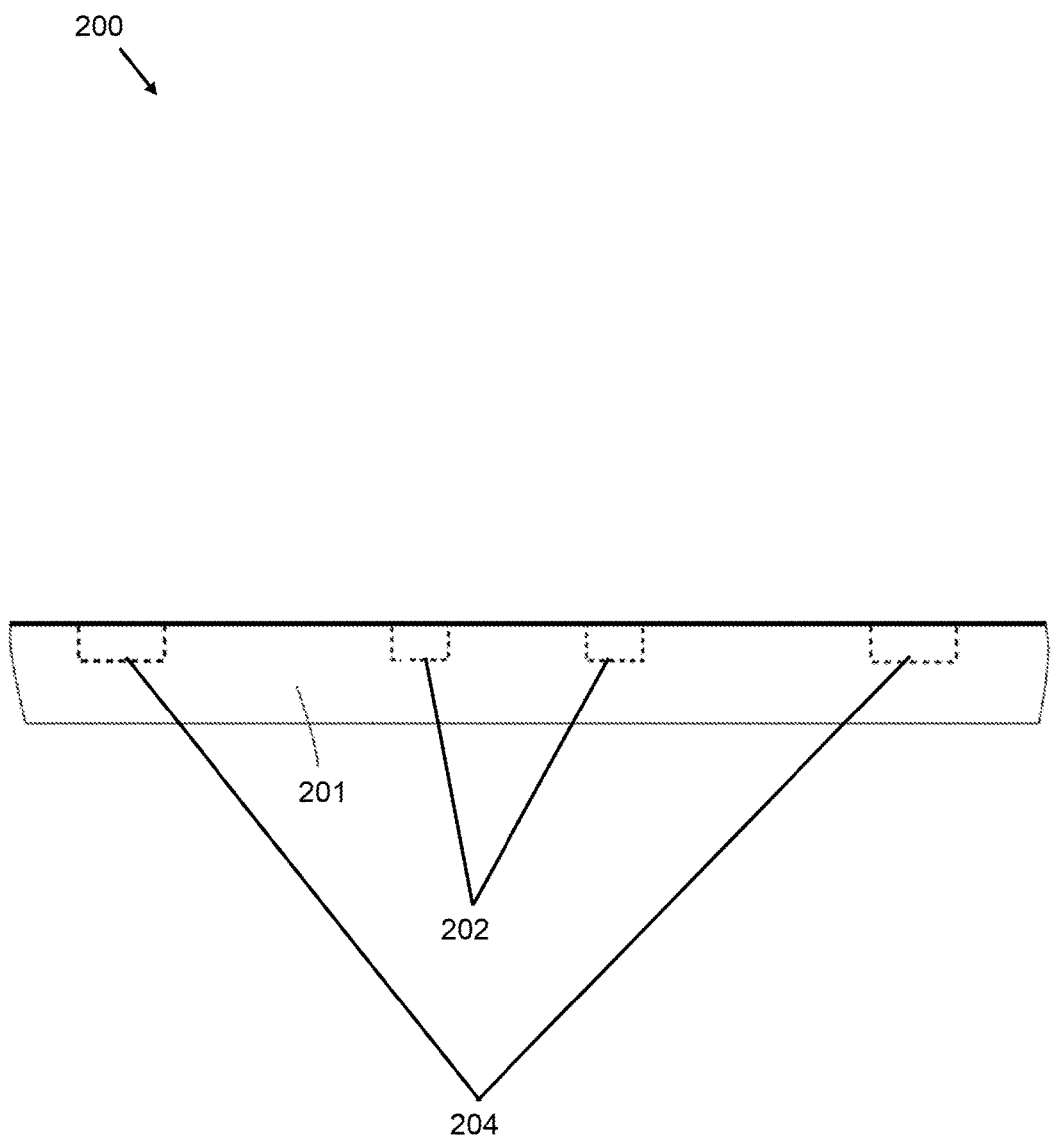
FIG. 3 shows the second stage in manufacturing a thermopile test structure according to an embodiment of the present invention.

FIG. 3 illustrates the thermopile test structure after fabrication of two temperature sensitive elements 202 and 204 within the substrate. As temperature sensitive elements, either diodes or well resistors may be used. The temperature sensitive elements are used as a temperature reference during electrical production testing. In certain embodiments they are positioned below the inner (hot) side of the thermopile (not yet fabricated in FIG. 3), element 202; and below the outer (cold) side of the thermopile, element 204. The invention may also be operated with more than two temperature sensitive elements. The invention may further be operated with only one temperature sensitive element, e.g. below the inner (hot) side of the thermopile. In the latter scenario, e.g. if the outer region of the thermopile is held at a known temperature, it may only be necessary to measure the temperature below the inner (hot) side in order to test the thermopile.

The temperature sensitive elements 202 and 204 enable independent temperature measurement in the hot and cold parts of the thermopile test structure. Diodes may be a preferred choice for the temperature sensitive elements because in general the thermal behaviour of diodes is very well known and precisely controlled. For example, when in use (e.g. during electrical production testing), a fixed forward bias voltage may be applied to the diodes, and the diode output current monitored as a function of temperature. Over a certain range, the output current is expected to depend exponentially on temperature and furthermore is very sensitive to small temperature changes. Alternatively, well resistors may be used as the temperature sensitive elements, or any combination of diodes and well resistors.

Figure 4:
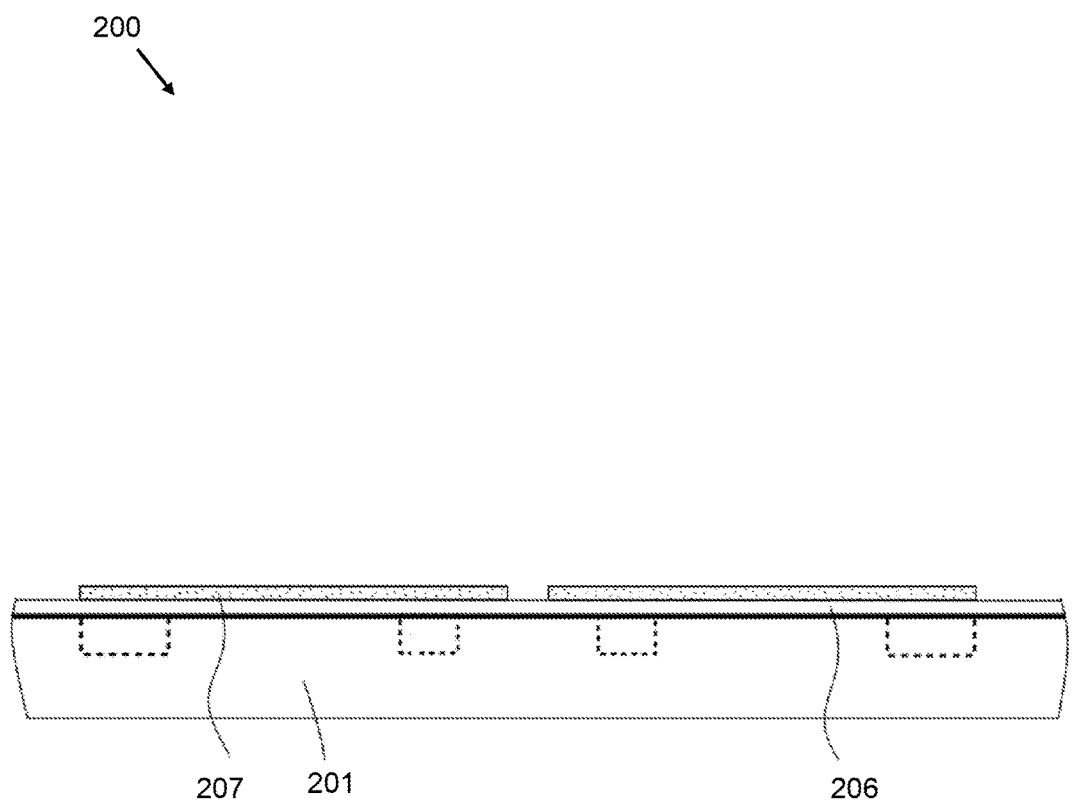
FIG. 4 shows the third stage in manufacturing a thermopile test structure according to an embodiment of the present invention.

FIG. 4 illustrates the thermopile test structure after fabrication of an insulator layer 206 (e.g. silicon dioxide) and first thermopile conductors 207 formed in a first conductive layer on top of the insulator layer (e.g. a polycrystalline semiconductor layer such as n- or p-type polysilicon). The first thermopile conductors are oblong in shape and extend parallel to the substrate from a point inward and above the inner-most temperature sensitive element 202 to a point substantially laterally commensurate with and above the outer-most temperature sensitive element 204. According to the embodiment shown in FIG. 4, the thermopile test structure has mirror symmetry in a line perpendicular to the substrate and bisecting the inner temperature sensitive element 202. However, such symmetry is not essential to the functioning of the thermopile test structure.

Figure 5:
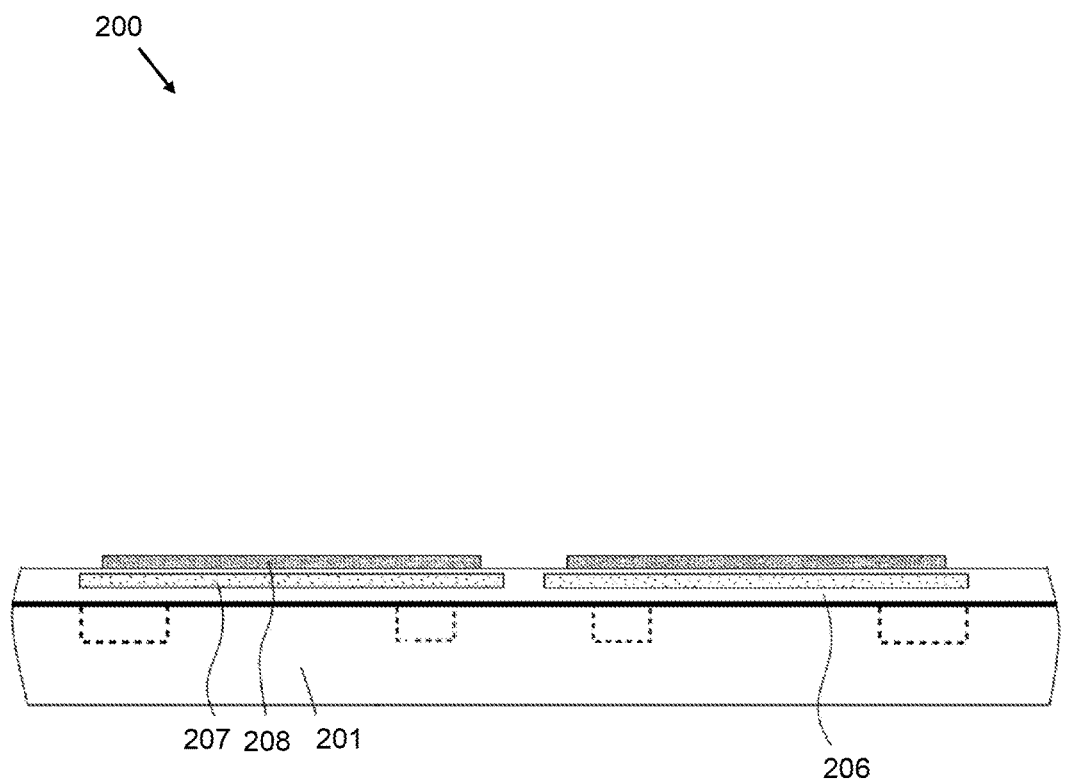
FIG. 5 shows the fourth stage in manufacturing a thermopile test structure according to an embodiment of the present invention.

FIG. 5 illustrates the thermopile test structure after further growth of the insulator layer 206, which now encapsulates the first thermopile conductors 207, and after fabrication of second thermopile conductors 208 formed in a second conductive layer (e.g. a polycrystalline semiconductor layer such as the other of n- or p-type polysilicon relative to the first thermopile conductor material 207). The first and second conductive layers may have a thickness between 100 nm and 400 nm. The insulator layer between the first and second conductive layers may have a thickness of 20 nm. The insulator layer between the substrate and the first conductive layer may have a thickness of between 200 nm and 500 nm. The second thermopile conductors also extend parallel to the substrate and, according to this embodiment, have a reduced extent in the direction parallel to the substrate compared to the first thermopile conductors, to enable interconnection of the different layers at a later stage in fabrication. Thus the second thermopile conductors are disposed above, parallel to and laterally co-centric with the first thermopile conductors.

The first and second thermopile conductors could be formed of any two materials having different Seebeck coefficients. Different semiconductor materials such as polycrystalline or amorphous silicon could be used, for example. These materials offer the advantage that the Seebeck coefficient can be tuned by ion implantation. Pairs of different metal materials/alloys are also contemplated.

Figure 6:
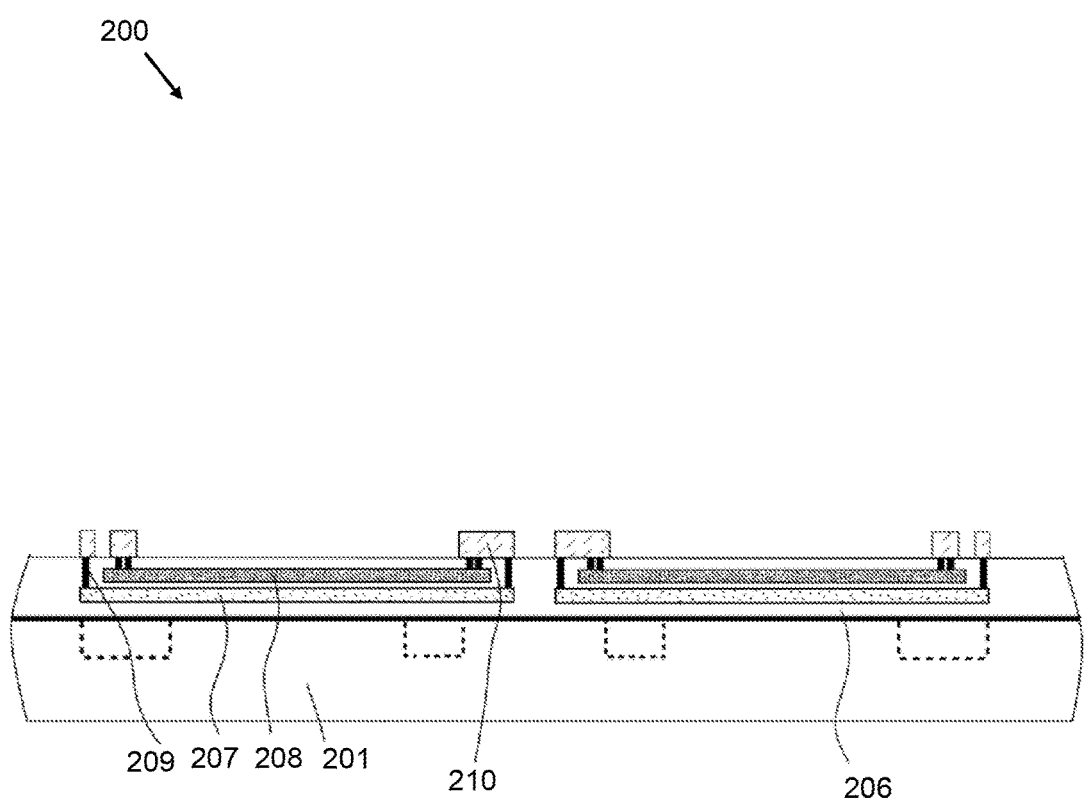
FIG. 6 shows the fifth, stage in manufacturing a thermopile test structure according to an embodiment of the present invention.

FIG. 6 illustrates the thermopile test structure after further growth of the insulator layer 206 (which now encapsulates both the first and second thermopile conductors), fabrication of a series of vias 209, and fabrication of a series of interconnectors/contacts in a first metal layer 210 for connecting the first and second thermopile elements of each thermocouple in the thermopile together by linking the associated vias in the metal layer 210.

Figure 7A:
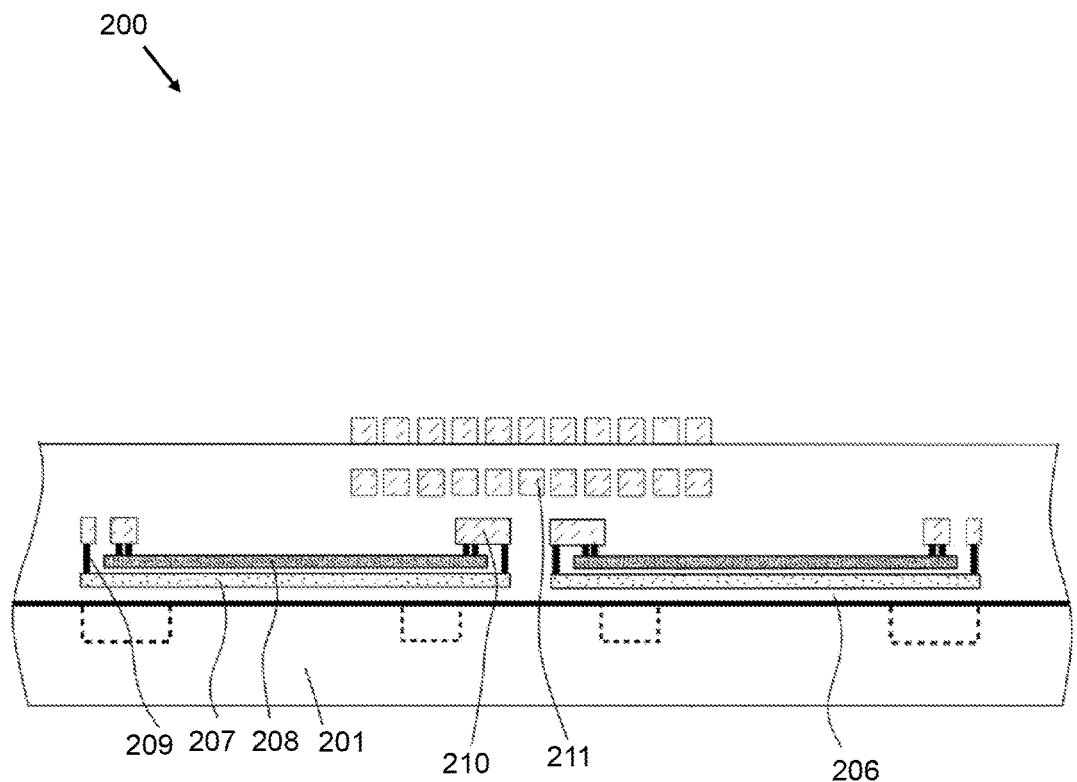
FIGS. 7a-7b show the sixth stage in manufacturing a thermopile test structure according to an embodiment of the present invention.

FIG. 7a illustrates the thermopile test structure after further growth of the insulator layer 206 (which now also encapsulates the vias 209 and interconnectors/contacts in the first metal layer 210) and after fabrication of a series of elements in a second metal layer 211 which may be used as a heater when the thermopile test structure is in use. The heater elements are located substantially above the central (hot) part of the thermopile. Alternatively, the thermopile test structure may itself not include its own heater but may be locally heated from an external heat source, e.g. localized incident infra-red radiation. The heater could alternatively be located in a metal layer located underneath the thermopile, e.g. between the temperature sensitive elements and the thermopile. It is envisaged that the heater could optionally be removed at a later stage by etching an optical window, thereby allowing more incident radiation to directly reach the thermopile. The total thickness of the first and second metal layers (210 and 211 respectively) and the surrounding and inter-disposed insulator 206 above the first and second conductive layers (207 and 208 respectively) is between 0.6 µm and 2 µm.

Figure 7B:
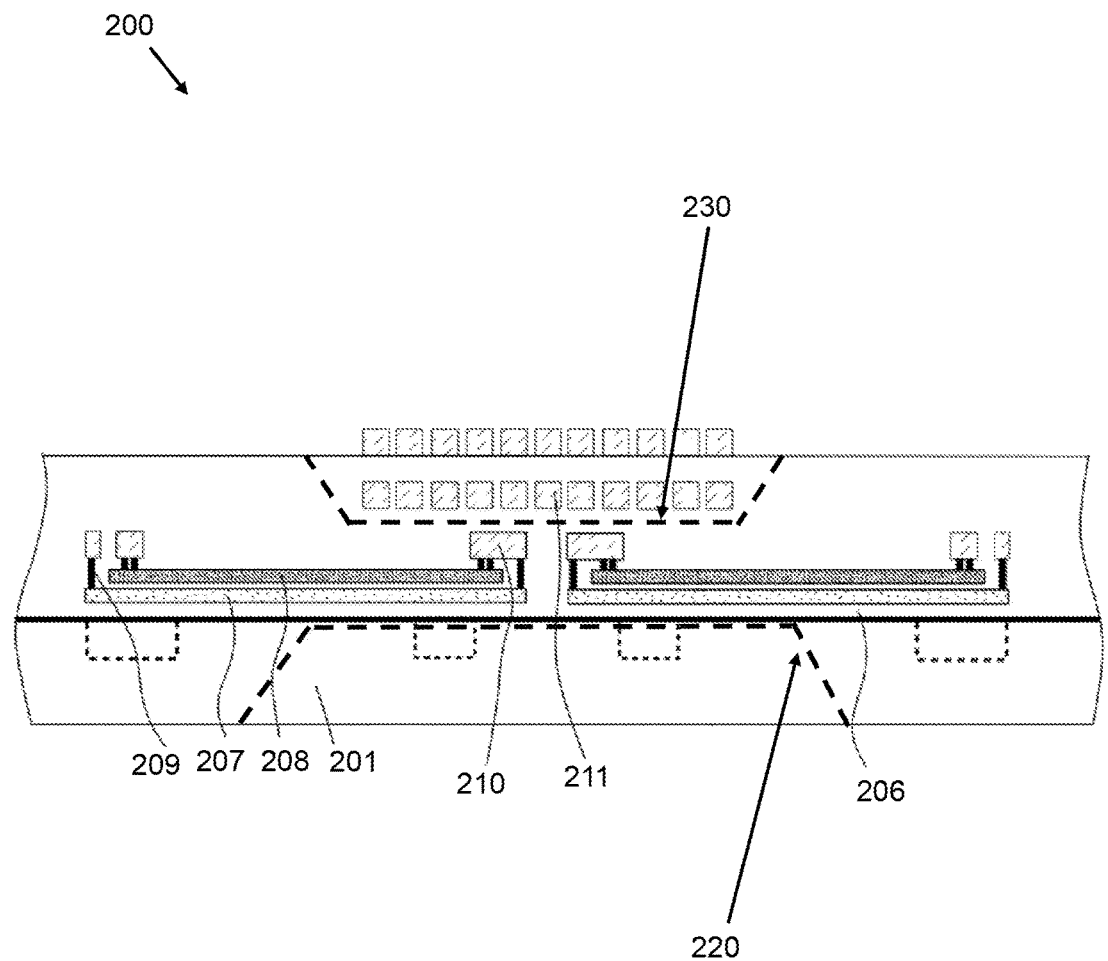

The inventors have also appreciated that the thermopile test structure according to certain embodiments of the present invention as described herein may alternatively become a customer device, and may not only serve the purpose of a test structure during the fabrication process. For example, after wafer testing, a membrane portion may be formed by back-etching (hollowing out) some or all of the substrate under the central (hot) part of the thermopile, removing some or all of the temperature sensitive elements in the process, such as substantially all of the inner temperature sensitive element 202. Since the device would already have been tested during the wafer testing stage the temperature sensitive elements are no longer required in the final customer device. This application of the invention still provides the benefit that the wafer can be tested during the wafer testing stage without the need to first hollow-out the substrate by back-etching. FIG. 7b illustrates the thermopile test structure of FIG. 7a, where dashed line 220 represents a possible profile of an optional back-etching procedure (to form a membrane portion) and dashed line 230 represents a possible profile of an optional top-etching procedure (optical window etch) to remove the heater elements 211 above the thermopile. The illustrated profiles are exemplary only and the actual profiles may resemble different geometries deepening on the technique used, e.g. wet/dry, isotropic/anisotropic etching.

Figure 8:
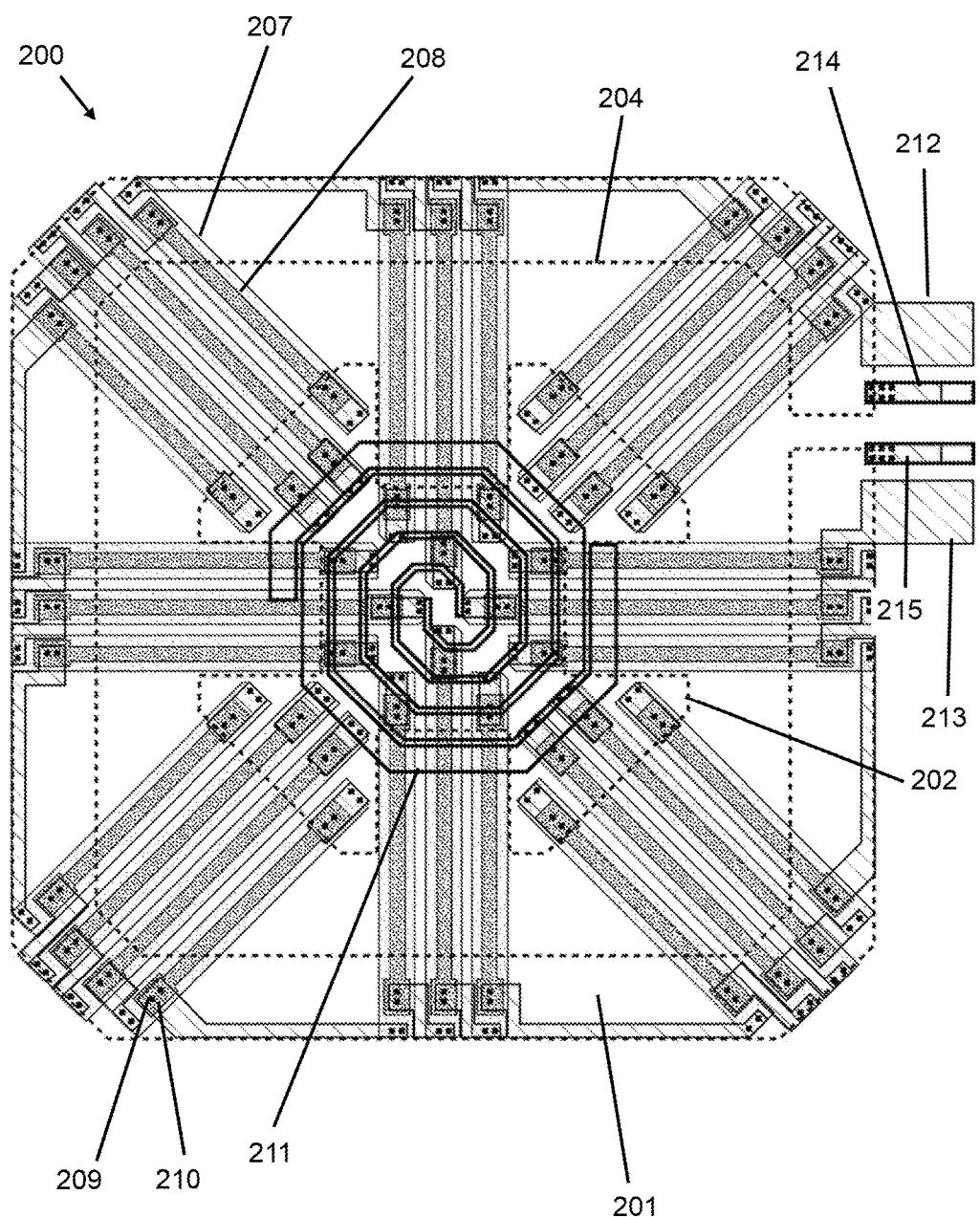
FIG. 8 shows a plan view of a thermopile test structure according to an embodiment of the present invention.

FIG. 8 is a plan view of an exemplary, finalised thermopile test structure according to an embodiment of the present invention. The overall structure has (approximately) 4-fold rotational symmetry. The thermopile geometry resembles two '+' shapes disposed at 45 degrees to each other with a common centre. The heater, formed in second metal layer 211, has the same centre as the thermopile, and resembles a spiral. The thermopile thus comprises 8 separate radially-extending 'arms' each comprising, in this embodiment, either 3 or 4 separate thermocouples. Neighbouring arms of the thermopile are electrically connected around the periphery of the device in the first metal layer 210, and in use a voltage is developed across the thermopile readout contacts 212 and 213, which may be connected to a voltmeter for testing. The thermopile shown in FIG. 8 comprises two temperature sensitive elements 202 and 204, each of which has an approximately ring-shaped geometry, centred on the thermopile. Temperature sensitive element 202 is disposed under the hot (inner) part of the thermopile and temperature sensitive element 204 is disposed under the cold (outer) part of the thermopile. Contacts 214 and 215 are connected to temperature sensitive element 204 to enable connection to external monitoring/testing equipment. There are at least two ways of realizing connection of the inner temperature sensitive element 202. For example, via one or more conductive layers above the substrate (metal, polysilicon) or, alternatively, within the substrate via a thin narrow portion of the inner (hot) temperature sensitive element 202 which itself extends into the outer area of the thermopile where it could be connected in a similar way as the outer temperature sensitive element 204.

It is envisaged that in production, a single semiconductor wafer may comprise two classes of devices namely:
  a set of 'customer' devices (each comprising a thermopile, in addition to other circuitry such as amplifiers etc.), which will be used in final products, for example; and
  a set of thermopile test structures as described herein.

Figure 9:
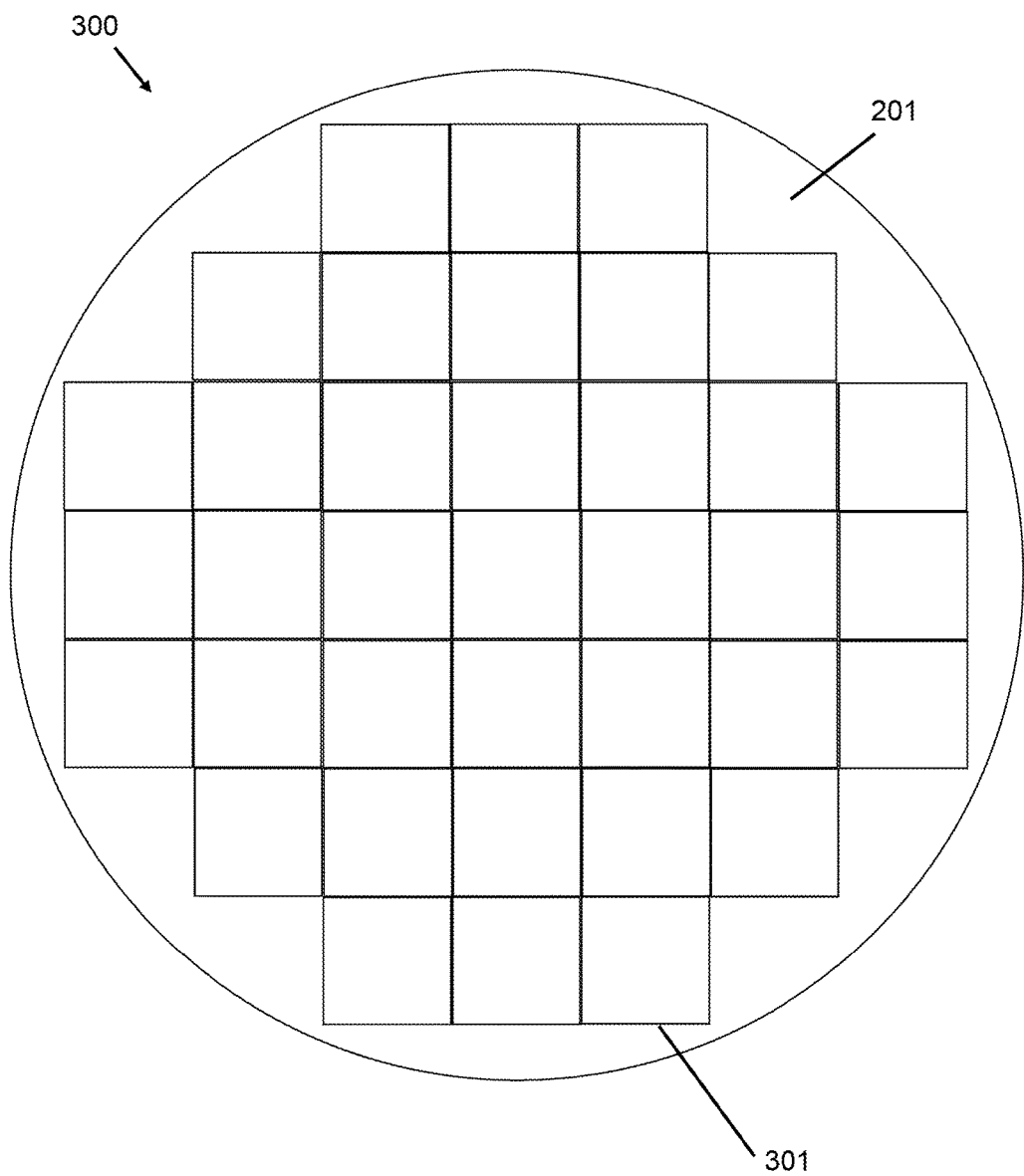
FIG. 9 shows a wafer comprising thermopile test structures according to an embodiment of the present invention.

In production, a single lithographic shot may comprise one or two thermopile test structures and 50-100 customer devices, for example, although other ratios are contemplated. A single wafer may comprise 40 lithographical shots, for example. An example wafer 300 layout is shown in FIG. 9. The wafer is subdivided into a number of lithographic shots 301, each of which contain a number of customer devices and thermopile test structures as detailed above.

Figure 10:
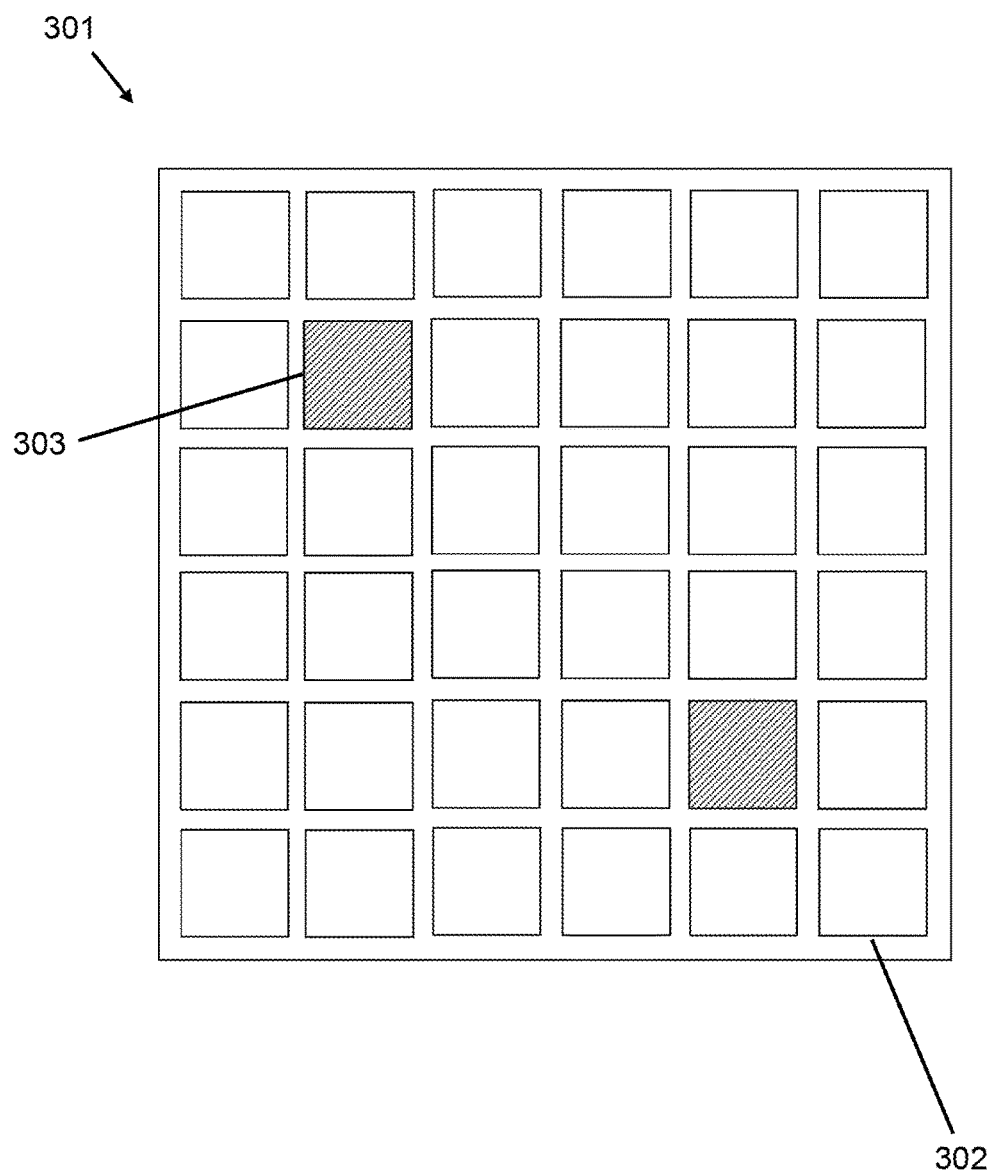
FIG. 10 shows a lithographic shot layout according to an embodiment of the present invention.

FIG. 10 illustrates an exemplary layout for a lithographic shot 301, wherein elements 302 are customer devices as defined above and elements 303 are thermopile test structures. Depending on requirements, the exact layout and ratio may be unimportant, and it may only be necessary that there be a sufficient number of thermopile test structures distributed across the wafer to be confident that if the thermopile test structures perform as expected then one can be reasonably sure that the customer devices will also be of a satisfactory standard—thereby verifying the production process has performed satisfactorily.

A method of characterizing the thermopile test structure according to an embodiment of the present invention will now be described. Such characterizing is typically performed as part of the overall manufacturing process. At the wafer testing stage, a current may be applied to the heater 211 to provide a heat source local to the inner side of the thermopile test structure. The output currents of the temperature sensitive elements 202 and 204, which according to this embodiment are diodes, are monitored, in addition to the output voltage of the thermopile itself (formed by elements 207-210 as described above). The diode output currents are used to calculate the temperature difference between the inner (hot) side and the outer (cold) side of the thermopile. This temperature difference is linked with the thermopile output voltage to characterize the sensitivity of the thermopile. The diodes are forward biased with a voltage typically in the range of 0.4 V to 0.9 V, and preferably approximately 0.7 V. The diode output current depends exponentially on temperature in a well-known and stable manner.

In any or all of the above embodiments the relative positions of the heater and temperature sensitive elements may not be of crucial importance, provided that when in use the heater can give rise to a temperature gradient across the thermopile which can be detected by the temperature sensitive elements. The relative positions of the temperature sensitive elements and the thermopile may be swopped compared to those as illustrated in the drawings and as described hereinabove. For example, the thermopile may be formed substantially within the substrate (by implantation, for example) with the temperature sensitive elements formed above the thermopile, i.e. on the substrate. Alternatively the thermopile may be formed on the substrate (substantially as illustrated and described hereinabove) but with the temperature sensitive elements formed above the thermopile.

Although the invention has been described in terms of certain embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A semiconductor product comprising:
   a semiconductor substrate; and
   a test structure comprising: a thermopile and at least two temperature sensitive elements, the at least two temperature sensitive elements being located in the substrate, or between the substrate and the thermopile,
   wherein one temperature sensitive element is located proximate a central portion of the thermopile and another temperature sensitive element is located proximate an outer portion of the thermopile.

2. The semiconductor product according to claim 1, wherein the at least two temperature sensitive elements each comprise a diode.

3. The semiconductor product according to claim 1, wherein the at least two temperature sensitive elements each comprise a well resistor.

4. The semiconductor product according to claim 1, wherein the thermopile comprises a polycrystalline semiconductor material.

5. The semiconductor product according to claim 1, wherein the semiconductor substrate comprises silicon.

6. The semiconductor product according to claim 1, wherein the test structure further comprises at least one conductive element, configured to function as a heater when in use.

7. The semiconductor product according to claim 6, wherein the at least one conductive element is disposed above the thermopile.

8. The semiconductor product according to claim 6, wherein one temperature sensitive element is located proximate a portion of the thermopile more susceptible to heating and another temperature sensitive element is located proximate a portion of the thermopile less susceptible to heating.

9. The semiconductor product according to claim 8, wherein the portion of the thermopile more susceptible to heating is a portion of the thermopile more proximate to said conductive element relative to the portion of the thermopile less susceptible to heating.

10. A wafer comprising one or more semiconductor products according to claim 1.

11. The wafer according to claim 10, further comprising one or more different semiconductor products, said different semiconductor products being distinct from the one or more semiconductor products according to claim 1.

12. The wafer according to claim 11, wherein the one or more semiconductor products according to claim 1 can be separated from the one or more different semiconductor products without damaging the one or more semiconductor products according to claim 1 and/or the one or more different semiconductor products.

13. The wafer according to claim 11, wherein each of the one or more different semiconductor products comprises a thermopile of substantially the same geometry as that of the one or more semiconductor products according to claim 1.

14. The wafer according to claim 13, wherein each of the one or more different semiconductor products is formed without said at least two temperature sensitive elements.

15. A method of manufacturing a semiconductor product comprising:
   providing a semiconductor substrate;
   forming at least two temperature sensitive elements at least partially within the substrate;
   forming a thermopile structure in one or more conductive layers above the substrate, wherein one temperature sensitive element is located proximate a central portion of the thermopile and another temperature sensitive element is located proximate an outer portion of the thermopile; and testing the thermopile prior to or without reducing the thickness of the substrate.

16. The method according to claim 15, further comprising reducing the thickness of the substrate, wherein at least one of the at least two temperature sensitive elements is at least partially removed.

17. The method according to claim 15, further comprising reducing the thickness of the substrate in a central portion underneath the thermopile to form a membrane portion.

18. The method according to claim 15, wherein the thermopile structure is formed in one or more conductive layers above the at least two temperature sensitive elements.

19. The method according to claim 15, wherein said testing comprises:
heating a portion of the thermopile; and
determining characteristics of the thermopile based on a readout from the at least one two temperature sensitive elements and a readout from the thermopile.

20. The method according to claim 19, wherein:
the thermopile comprises a cold side and a hot side and one of the at least two temperature sensitive elements is situated beneath the cold side or the hot side; and
the heating a portion of the thermopile comprises heating the hot side of the thermopile more than the cold side of the thermopile.

21. The method according to claim 20, wherein the at least two temperature sensitive elements each comprising a diode, and wherein determining characteristics of the thermopile comprises:
measuring an output voltage of the thermopile;
measuring an output current of the diodes, and based on known characteristics of the diodes determining a measure of the temperature difference between the hot side and the cold side of the thermopile; and
linking the measure of the temperature difference between the hot side and the cold side of the thermopile with the output voltage of the thermopile to obtain a characterization of the thermopile.

22. A method for use in conjunction with a wafer formed of a semiconductor substrate, the wafer comprising:
at least one first structure having a first thermopile; and
at least one second structure, distinct from the first structure, said second structure comprising a test structure comprising: a second thermopile and at least two temperature sensitive elements, the at least two temperature sensitive elements being located in the substrate, or between the substrate and the second thermopile,
wherein one temperature sensitive element is located proximate a central portion of the second thermopile and another temperature sensitive element is located proximate an outer portion of the second thermopile,
the method comprising:
assessing the quality of the first structure by performing a test on the second structure.

23. The method according to claim 22, wherein the test comprises determining the sensitivity of the second thermopile of the second structure based on a readout from the at least two temperature sensitive elements.

24. The method according to claim 22, further comprising utilizing at least one said first structure in forming at least part of a semiconductor product, conditioned on an outcome of said test.

* * * * *